(12) United States Patent
Nguyen

(10) Patent No.: US 7,087,522 B2
(45) Date of Patent: Aug. 8, 2006

(54) MULTILAYER COPPER STRUCTURE FOR IMPROVING ADHESION PROPERTY

(75) Inventor: Tue Nguyen, Fremont, CA (US)

(73) Assignee: Tegal Corporation, Petaluma, CA (US)

( * ) Notice: Subject to any disclaimer, the term of this patent is extended or adjusted under 35 U.S.C. 154(b) by 219 days.

(21) Appl. No.: 10/795,950

(22) Filed: Mar. 8, 2004

(65) Prior Publication Data

US 2004/0171251 A1    Sep. 2, 2004

Related U.S. Application Data

(63) Continuation of application No. 10/225,920, filed on Aug. 23, 2002, now Pat. No. 6,777,331, which is a continuation-in-part of application No. 09/519,965, filed on Mar. 7, 2000, now abandoned.

(51) Int. Cl.
    *H01L 21/44* (2006.01)
(52) U.S. Cl. .............................. 438/654; 257/E21.011
(58) Field of Classification Search ................ 438/687, 438/642, 643–645, 652–654, 658, 659, 648, 438/683, 722, 677, 680, 681, 627
    See application file for complete search history.

(56) References Cited

U.S. PATENT DOCUMENTS

| | | | |
|---|---|---|---|
| 5,693,363 A | 12/1997 | Kuroda et al. | 427/78 |
| 5,744,394 A | 4/1998 | Iguchi et al. | 438/276 |
| 5,904,565 A | 5/1999 | Nguyen et al. | 438/687 |
| 5,909,563 A | 6/1999 | Jacobs et al. | 710/305 |
| 5,913,144 A | 6/1999 | Nguyen et al. | 438/643 |
| 5,953,634 A | 9/1999 | Kajita et al. | 438/687 |
| 6,403,465 B1 | 6/2002 | Liu et al. | 438/627 |
| 6,436,825 B1 | 8/2002 | Shue | 438/687 |
| 2003/0073301 A1 | 4/2003 | Nguyen et al. | |

OTHER PUBLICATIONS

Deposition of copper barrier and seed layers with atomic layer control, by Suvi Haukka et al., International Interconnect Technology Conference, Jun. 3-5, 2002, paper 14-01.
Table 3.4, Main prototype of high-Tc superconductors, Chapter 3.3 in Solid State Chemistry.

*Primary Examiner*—W. David Coleman
*Assistant Examiner*—Jarrett Stark
(74) *Attorney, Agent, or Firm*—Fliesler Meyer LLP

(57) ABSTRACT

A multilayer copper structure has been provided for improving the adhesion of copper to a diffusion barrier material, such as TiN, in an integrated circuit substrate. The multilayer copper structure comprises a thin high-resistive copper layer to provide improved adhesion to the underlying diffusion barrier layer, and a low-resistive copper layer to carry the electrical current with minimum electrical resistance. The invention also provides a method to form the multilayer copper structure.

25 Claims, 2 Drawing Sheets

MULTILAYER COPPER STRUCTURE FOR IMPROVING ADHESION PROPERTY

This application is a continuation of U.S. application Ser. No. 10/225,920, filed Aug. 23, 2002 now U.S. Pat. No. 6,777,331, which was a continuation-in-part of application Ser. No. 09/519,965, filed Mar. 7, 2000, now abandoned.

FIELD OF THE INVENTION

This invention relates generally to integrated circuit processes and fabrication, and more particularly, to a method of improving the adhesion property of copper to a diffusion barrier structure.

BACKGROUND OF THE INVENTION

The demand for progressively smaller, less expensive, and more powerful electronic products creates the need for smaller geometry integrated circuits (ICs), and large substrates. It also creates a demand for a denser packaging of circuits onto IC substrates. The desire for smaller geometry IC circuits requires that the dimensions of the interconnection between components and dielectric layers be as small as possible. Therefore, recent research continues developing methods of reducing the cross section area of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from joining conductors having highly different resistivity characteristics.

There is a need for interconnects and vias that have low resistivity, and the ability to withstand volatile process environments. Aluminum and tungsten metals are often used in the production of integrated circuits for making-interconnections or vias between electrically active areas. These metals are popular because there is much knowledge, experience and expertise due to the long term usage in production environment.

Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Copper is approximately ten times more resistance to electromigration than aluminum. As a result, a copper line, even one having a much smaller cross-section than an aluminum line, is better able to maintain electrical integrity.

However, there have been problems associated with the use of copper in IC processing. Copper poisons the active area of silicon devices, creating unpredictable responses. Copper also diffuses easily through many materials used in IC processes and, therefore, care must be taken to keep copper from migrating.

Various means have been suggested to deal with the problem of copper diffusion into integrated circuit materials. Several materials, including metals and metal alloys, have been suggested for use as barriers to prevent copper diffusion. The typical conductive diffusion barrier materials are TiN, TaN and WN. Addition of silicon into these materials to create TiSiN, TaSiN, WSiN, could improve the diffusion barrier properties. For non-conductive diffusion barrier, silicon nitride has been the best material so far. However, adhesion of copper to these diffusion barrier materials has been, and continues to be, an IC process problem.

The conventional process of sputtering, used in the deposition of aluminum, will not work well when the geometry of the selected IC features becomes small. Therefore new deposition processes have been used to deposit diffusion barrier and copper lines and interconnects in an integrated circuit. It is impractical to sputter metal, either aluminum or copper, to fill small diameter vias, since the gap filling capability is poor. One of the techniques to deposit copper that provides excellent gap fill capability is the chemical vapor deposition (CVD) technique.

In a typical copper CVD process, copper is combined with a ligand, or a organic compound, to make the copper volatile. That is, copper becomes an element in a compound, called a precursor, that is vaporized into a gas. Selected surfaces of an integrated circuit, such as that of diffusion barrier materials, are exposed to the copper precursor in an elevated temperature environment. When the copper precursor decomposes, copper is left behind on the selected surfaces and the remaining gases (by-products) are exhausted away. Several copper precursors are available for use with the CVD process. It is generally accepted that the configuration of the copper precursors, at least partially, affects the ability of the copper residue to adhere itself to the selected surfaces. Although certain precursors may improve the copper adhesion process, variations in the diffusion barrier surfaces to which the copper is applied, and variations in the copper precursors themselves, often result in unsatisfactory adhesion of copper to a selected surface.

Similarly, diffusion barrier materials could be deposited by the chemical vapor deposition technique. For example, in the case of TiN CVD deposition, a precursor that contains Ti and optionally nitrogen, is used. The precursor decomposes at the selected surfaces, and the decomposed elements react together to form a TiN layer on these selected surfaces. Precursor by-products (products formed as the precursor decomposes that do not participate in the reactions) and reaction by-products (products formed from the reaction that do not deposit on the selected surfaces) are often volatile and are exhausted away.

Another deposition technology similar to the CVD technique is atomic layer deposition (ALD). In ALD various gases are injected into the chamber for as short as 100–500 milliseconds in alternating sequences. For example, a first gas is delivered into the chamber for about 500 milliseconds and the substrate is heated, then the first gas (heat optional) is turned off. The residue from the first gas is then evacuated. Another gas is delivered into the chamber for another 500 milliseconds (heat optional). The residue from this gas is also evacuated before the next gas is delivered for about 500 milliseconds (and optionally heated). This sequence is done until all gases have been cycled through the chamber, each gas sequence typically forms a monolayer which is highly conformal. ALD technology thus pulses gas injection and heating sequences that are between 100 and 500 milliseconds. This approach has a high dissociation energy requirement to break the bonds in the various precursor gases such as silane and oxygen and thus requires the substrate to be heated to a high temperature, for example in the order of 600–800 degree Celsius for silane and oxygen processes.

ALD also uses radical generators, such as plasma generators, to increase the reactivity of the second gas and effect the reaction between the first and the second gases at the substrate. U.S. Pat. No. 5,916,365 to Sherman entitled "Sequential chemical vapor deposition" provides for sequential chemical vapor deposition by employing a reactor operated at low pressure, a pump to remove excess reactants, and a line to introduce gas into the reactor through a valve. Sherman exposes the part to be coated to a gaseous first reactant, including a non-semiconductor element of the thin film to be formed, wherein the first reactant adsorbs on the part. The Sherman process produces sub-monolayer per gas injection due to adsorption. The first reactant forms a monolayer on the part to be coated (after multiple cycles), while the second reactant passes through a radical generator which partially decomposes or activates the second reactant into a gaseous radical before it impinges on the monolayer. This second reactant does not necessarily form a monolayer but is available to react with the deposited monolayer. A pump removes the excess second reactant and reaction products completing the process cycle. The process cycle can be repeated to grow the desired thickness of film.

There are other applications using plasma in ALD process. U.S. Pat. No. 6,200,893 to Sneh entitled "Radical-assisted sequential CVD" discusses a method for CVD deposition on a substrate wherein radical species are used in alternate steps to depositions from a molecular precursor to treat the material deposited from the molecular precursor and to prepare the substrate surface with a reactive chemical in preparation for the next molecular precursor step. By repetitive cycles a composite integrated film is produced. In a preferred embodiment the depositions from the molecular precursor are metals, and the radicals in the alternate steps are used to remove the ligands left from the metal precursor reactions, and to oxidize or nitride the metal surface in subsequent layers.

In one embodiment taught by Sneh, a metal is deposited on a substrate surface in a deposition chamber by (a) depositing a monolayer of metal on the substrate surface by flowing a molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with an inert gas; (d) flowing at least one radical species into the chamber and over the surface, the radical species is highly reactive with the surface ligands of the metal precursor layer and eliminates the ligands as reaction product, and saturates the surface, providing the first reactive species; and (e) repeating the steps in order until a metallic film of desired thickness results.

In another Sneh aspect, a metal nitride is deposited on a substrate surface in a deposition chamber by (a) depositing a monolayer of metal on the substrate surface by flowing a metal precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the atomic species highly reactive with the surface ligands of the metal precursor layer and eliminating the ligands as reaction product and also saturating the surface; (e) flowing radical nitrogen into the chamber to combine with the metal monolayer deposited in step (a), forming a nitride of the metal; (f) flowing a third radical species into the chamber terminating the surface with the first reactive species in preparation for a next metal deposition step; and (g) repeating the steps in order until a composite film of desired thickness results.

The Sneh embodiments thus deposit monolayers, one at a time. This process is relatively time-consuming when a thick film is desired.

Another application of sequential deposition is nanolayer thick film deposition (NLD) which is disclosed in U.S. patent application Ser. No. 09/954,244 filed on Sep. 10, 2001 to Tue Nguyen et al. NLD is a process of depositing a thin film by chemical vapor deposition, including the steps of evacuating a chamber of gases, exposing a workpiece to a gaseous first reactant, wherein the first reactant deposits on the workpiece to form the thin film, then evacuating the chamber of gases, and exposing the workpiece, coated with the first reactant, to a gaseous second reactant under plasma, wherein the thin film deposited by the first reactant is treated to form the same materials or a different material.

In comparison with CVD, atomic layer deposition (ALD or ALCVD) is a modified CVD process that is temperature sensitive and flux independent. ALD is based on self-limiting surface reaction. ALD provides uniform deposition over complex topography and is temperature independent since the gases are adsorbed onto the surface at lower temperatures than that of CVD because it is in the adsorption regime.

As discussed in Sherman and Sneh, the ALD process includes cycles of flowing gas reactant into the chamber, adsorbing one sub-monolayer onto the wafer surface, purging the gas reactant, flowing a second gas reactant into the chamber, and reacting the second gas reactant with the first gas reactant to form a monolayer on the wafer substrate. Thick film is achieved by deposition of multiple cycles.

It has become standard practice in the semiconductor industry to apply CVD copper immediately after the deposition of the diffusion barrier material to the integrated circuit to improve the adhesion and to reduce the contact resistance. Typically, the processes are performed in a single chamber or an interconnected cluster chamber. It has generally been thought that the copper layer has the best chance of adhering to the diffusion barrier material when the diffusion barrier material surface is clean and free of contaminants. Hence, the diffusion barrier surface is often kept under vacuum, or in a controlled environment, and the copper is deposited on the diffusion barrier as quickly as possible. However, even when copper is immediately applied to the diffusion barrier surface, copper adhesion to the diffusion barrier remains a problem.

The problem is compounded because good diffusion barrier materials adhere poorly to most materials. In addition, copper also has a low adhesion property to many materials. Therefore adhesion of direct CVD copper to a diffusion barrier surface is even more difficult.

To improve the adhesion property of copper to a diffusion barrier, it is imperative to change the interfacial property between the copper and the diffusion barrier. U.S. Pat. No. 5,909,637, to Charneski, et al., entitled "Copper adhesion to a diffusion barrier surface and method for same", proposed a method to use reactive gas species to clean the surface of the diffusion barrier to improve the adhesion to the subsequently deposited copper layer. This method has very limited success and often does not provide enough adhesion to be practical. U.S. Pat. No. 5,913,144, to Nguyen, et al., entitled "Oxidized diffusion barrier surface for the adherence of copper and method for same", further proposed a method to use reactive oxygen species to oxidize the diffusion barrier surface to improve the adhesion to the subsequently deposited copper layer. This method works well to improve the adhesion property, but by oxidizing the barrier material and producing a non conductive layer, even a very thin layer, significantly increases the contact resistance of the integrate circuit. A co-pending application Ser. No. 10/292,929 filed Nov. 13, 2002, now U.S. Pat. No. 6,670,266 to Nguyen, et al. entitled "Multilayer diffusion barrier structure for improving adhesion property" disclosed a method to partially incorporate oxygen into the thin diffusion barrier surface to improve the adhesion of copper to the diffusion barrier without the formation of a non conductive oxide layer.

However, the thickness of the diffusion barrier is much thinner than the thickness of the copper layer because much of the conductive area needs to be devoted to copper in order to improve the conductivity. Therefore modifying the copper layer to improve adhesion to the diffusion barrier is much simpler than modifying the diffusion barrier.

It would be advantageous to develop a copper structure having improved adhesion of CVD copper to a diffusion barrier material surface.

It would be advantageous to employ a method of improving the adhesion of CVD copper to a diffusion barrier material surface without modifying the diffusion barrier structure.

It would be advantageous to employ a method of improving the adhesion of CVD copper to a diffusion barrier material surface that can be optimized with respect to the contact resistance.

Accordingly, a structure and method of improving the adhesion of copper to the diffusion barrier surface are provided. The structure is a multilayer copper structure, comprising layers of:
  a) a thin high-resistive copper layer, whereby this layer serves to improve the adhesion of copper to the underlying diffusion barrier layer; and
  b) a low-resistive copper layer, in which the resistivity of the low resistive layer is lower than the resistivity of the high resistive layer, whereby this layer serves to carry the electrical current with minimum electrical resistance.

The presence of oxygen tends to promote the adhesion of copper to a certain diffusion barrier materials. TiN, for example, exhibits much improved adhesion to copper when being oxidized. The resistivity of TiN is around 100–1000 $\mu\Omega$-cm, depending on the deposition technique. After being oxidized, the film becomes non conductive, thus it is not suitable for conductive diffusion barrier. Providing a thin oxide to use tunneling phenomenon for conduction, a method proposed in U.S. Pat. No. 5,913,144 to Nguyen, et al., would not be a reliable method since the resistance based on the tunneling current is exponentially proportional to the thickness of the oxide film. Oxy-nitriding the TiN film, a method proposed in a co-pending patent application Ser. No. 10/292,929, filed Nov. 13, 2002, now U.S. Pat. No. 6,670,266 to Nguyen, et al., entitled "Multilayered diffusion barrier structure for improving adhesion property", would be a preferred method since the amount of oxygen incorporating into the TiN film could be adjusted to optimizing the adhesion and the film resistance. However the difficulty with oxy-nitriding the diffusion barrier is the thickness and the high resistivity of the TiN film. Therefore the current invention discloses a structure to improve the adhesion. The deposited copper film comprises two layers, a high resistive copper layer to serve as an adhesion layer, and a low resistive copper layer in which the resistivity of the low resistive layer is lower than the resistivity of the high resistive layer, whereby this layer serves to carry the electrical current with minimum electrical resistance.

The thickness of the high resistive copper layer in the multilayered copper can be less than 5 nm. The thickness of this layer is optimization between the desired adhesion and the overall resistivity. Since the high resistive copper layer typically has lower resistivity than the diffusion barrier, the thickness can be high without affecting the overall resistivity significantly.

The increase in resistivity of the high-resistive copper layer can be due to the presence of excess oxygen. The oxygen incorporated in the copper layer in the form of impurities or in the form of copper oxides, thus raising the resistivity. The presence of oxygen in the high-resistive copper layer promotes the bonding with the selected underlying diffusion barrier such as TiN. In some aspects of the invention, the multilayered copper structure further comprises a diffusion barrier structure. With the enhanced adhesion feature of the multilayered copper structure, the diffusion barrier structure could just be a simple diffusion barrier layer. To further improve the adhesion, the diffusion barrier could be a multilayered diffusion barrier structure, like the one disclosed in a co-pending patent application Ser. No. 10/292,929, filed Nov. 13, 2002, now U.S. Pat. No. 6,670,266 to Nguyen, et al., entitled "Multilayered diffusion barrier structure for improving adhesion property".

The current invention also provides a method to form the multilayered copper structure to improve the adhesion to an underlying diffusion barrier structure. The method comprises the steps of:
  a) depositing a thin high-resistive copper layer, whereby this high-resistive layer serves to improve the adhesion of copper to the underlying diffusion barrier layer;
  b) treating the thin high-resitive copper layer to reduce the resistance of the thin high-resistive copper layer, whereby the treatment step improves the conductivity of the high-resistive copper layer without destroying the adhesion property; and
  c) depositing a low-resistive copper layer, in which the resistivity of the low-resistive layer is lower than the resistivity of the treated high-resistive layer, whereby this layer serves to carry the electrical current with minimum electrical resistance.

The high-resistive copper layer is needed for adhesion purpose, but the high resistance of this layer is a side effect. The high resistance of the copper layer is normally achieved by the introduction of oxygen to form copper oxide. But copper oxide is not an electrically conductive material, therefore if the high-resistive layer is composed of 100% copper oxide, it would be non-conducting and the circuit would be broken. The amount of oxygen incorporated would be small so that the high-resistive copper layer is still conducting. In other words, the high-resistive copper layer would be composed mainly of copper with only a small fraction of copper oxide to improve adhesion and have high conductance.

To improve the conductance without sacrify the adhesion, a treatment step is performed following the formation of the high-resistive copper layer. The purpose of the treatment step is to reduce the resistance of the high-resistive copper layer without destroying the adhesion. There is no need to reduce the resistance to that of copper metal level, because that would damage the adhesion. The amount of resistance reduction can be controlled so that there is a balance between resistivity and adhesion.

There are various ways to reduce copper oxide to copper metal. The basic technique is by oxygen gettering. A special purpose chemical is introduced to get oxygen from the copper oxide layer, meaning reacting with copper oxide to form copper metal and some by-products. One method uses plasma hydrogen. Energetic hydrogen will react with copper oxide to take oxygen away from copper oxide. Another method uses an organic compound such as a composition of alcohols, aldehydes and formic acid. The organic compound will react with copper oxide to reduce it to copper metal with volatile by-products to be exhausted away. Still another method uses special metals. Special metals with lower heat of formation than that of copper oxide will take oxygen from copper oxide. This special metal will need to have the oxide phase conductive so that the total resistivity of the high-resistive layer is reduced. Examples of metals that have its oxide phase conducting are iridium, indium tin, tin. Selecting the special metals needs to take into consideration the possibility of the alloying property of copper with this special metal. Still another method is the alloying property of copper oxide to form high temperature superconducting material. Materials such as La, Sr, Nd, Ce, Y, Ba, Pb, Tl, and Ca can combine with copper and oxygen in certain compositions to form superconducting material. At the current progress, the temperature for superconducting is still lower than room temperature. However, its resistivity is much less than nonconducting materials.

In some aspects of the invention, the increase in resistivity of the high-resistive copper layer is due to the presence of oxygen.

To be effective in treating the high-resistive copper layer, the layer lo might have to be thin enough. Therefore the current invention also disclose a method where the formation of the high-temperature copper layer and the treatment of this layer are repeated many times until achieving a desired thickness before depositing the low-resistive copper layer. The desired thickness can be directly related to the adhesion property.

In some aspects of the invention, the total thickness of the treated high-resistive copper layer in the multilayered copper is less than 5 nm. In some aspects of the invention, the resistivity of the high-resistive copper layer is between 10 to 500 μΩ-cm, and the resistivity of the treated high-resistive copper layer is between 3 to 400 μΩ-cm.

To be effective in treating the high-resistive copper layer, the layer might have to be thin. Therefore the thickness of the high-resistive copper layer can be less than a monolayer, which is roughly about 0.5 nm. The formation of less-than-a-monolayer thickness can be performed by an ALD method. In ALD method, a copper carrying precursor can be adsorbed on the surface of a workpiece to form a copper layer. The resistivity of this layer depends on the precursor. The resistivity of this layer can also be modified by adding an oxygen carrying precursor.

The thin high-resistive copper layer can be deposited by the chemical vapor deposition technique. Copper CVD deposition uses liquid precursors such as Cu-hfac-L, in which hfac is hexafluoroacetylacetonate, and L is a ligand that permits the copper precursor to deposit pure copper. Typical L is trimethylvinylsilane (tmvs), alpha methyl styrene, and 3-hexene, dimethyl cyclooctadiene. For lowest resistivity, copper-hfac-tmvs requires an additional small amount of water as disclosed in U.S. Pat. No. 5,744,192, to Nguyen, et al. entitled "Method of using water vapor to increase the conductivity of copper deposited with Cu(hfac) tmvs". As the water amount increases, the film resistivity increases. For Cu(hfac)tmvs blend, a mixture of Cu(hfac) tmvs and other ingredients including water, the optimum copper film will require different amounts of water since there is already some water incorporated in the copper precursor. With different precursors and process conditions, controlling the resistivity level in the copper layer is a simple and straightforward matter by changing the amount of impurity such as oxygen. The current invention provides a thin high-resistive copper layer with a resistivity between 10 to 500 μΩ-cm. In one aspect of the invention, the modification of resistivity is achieved by exposing the precursor to a plasma source, where the exposure serves to break up the precursors for easier incorporation of impurities into the high-resistive copper layer. The modification of resistivity can be achieved by an oxygen-containing precursor. The oxygen-containing precursor serves to incorporate oxygen into the deposited copper layer to achieve the resistivity between 2 to 500 μΩ-cm. The oxygen-containing precursor is a precursor comprising an oxygen species such as $O_2$, $N_2O$, $NO_2$, water vapor, alcohol vapor, OH ligand, and chemicals containing OH ligand, chemicals releasing OH ligand upon annealing.

In other aspects of the invention, the resistivity of the low-resistive copper layer is less than 3 μΩ-cm.

The current invention also provides a method to deposit the low-resistive copper film by the electrochemical deposition technique or by the chemical vapor deposition technique. The electrochemical deposition technique needs a copper seed layer to deposit and have good purity film. The current invention also provides a method to deposit the low-resistive copper film by the chemical vapor deposition technique and then by the electrochemical deposition technique.

The invention also provides a further step, preceding step a) to deposit an underlying diffusion barrier structure on a substrate, whereby the diffusion barrier structure serves to block the diffusion of copper to the substrate.

The diffusion barrier could be a single layer diffusion barrier, or a multilayered diffusion barrier structure, as disclosed by co-pending patent application Ser. No. 10/292, 929 filed Nov. 13, 2002, now U.S. Pat. No. 6,670,266 to Nguyen, et al., entitled "Multilayered diffusion barrier structure for improving adhesion property".

The chemical vapor deposition technique uses a combination of process precursors and process conditions with the process precursors comprising a liquid copper precursor and an oxygen-contained precursor, whereby the liquid copper precursor serves to deposit a copper layer, and the oxygen-contained precursor serves to modifying the copper layer's resistivity by incorporating oxygen into the deposited copper layer.

The thin high-resistive film by chemical deposition technique has a high ratio of the oxygen-contained precursor, such as water or alcohol, to the copper precursor, such as Cu(hfac)tmvs. The high ratio can be accomplished by a high flow of oxygen-containing precursor, or alternatively, a low flow of copper precursor. Low flow of copper precursor has the additional benefit of allowing time for the copper to react with the diffusion barrier, similar to the method disclosed in U.S. Pat. No. 5,948,467, to Nguyen, et al., entitled "Enhanced CVD copper adhesion by two-step deposition process". This invention differs from U.S. Pat. No. 5,948, 467 to Nguyen, et al., because of the presence of the oxygen-contained precursor. The major adhesion promoter in this invention is oxygen, not the reaction time. The low-resistive film by chemical deposition technique has a low ratio of the oxygen-contained precursor to the copper precursor. The low ratio can be accomplished by a low flow of the oxygen-contained precursor, or alternately, a high flow of the copper precursor. In the case of a copper precursor blend, meaning a copper precursor with oxygen-contained additive such as water, Hhfac dihydrate, the oxygen-contained precursor is no longer necessary, thus there is no flow of the oxygen-containing precursor.

The flow of the oxygen-contained precursor, such as water vapor, is between 1–100 $cm^3$/minute. The copper precursor is typically a liquid, and the unit is ml of liquid. The liquid copper precursor is converted to gas phase by passing through a vaporizer. The oxygen-containing precursor though it could be in a liquid form such as water or alcohol, is much more desirable to be in a gaseous form for the reaction. The liquid oxygen-containing precursor, such as water, is bubbled with an inert gas, and the inert gas carries the dissolved liquid to the reaction chamber. The flow unit of the oxygen-containing precursor is $cm^3$ of inert gas with some amount of liquid oxygen-contained precursor dissolved within.

DETAIL DESCRIPTION OF THE PREFERRED EMBODIMENT

Figure 1:
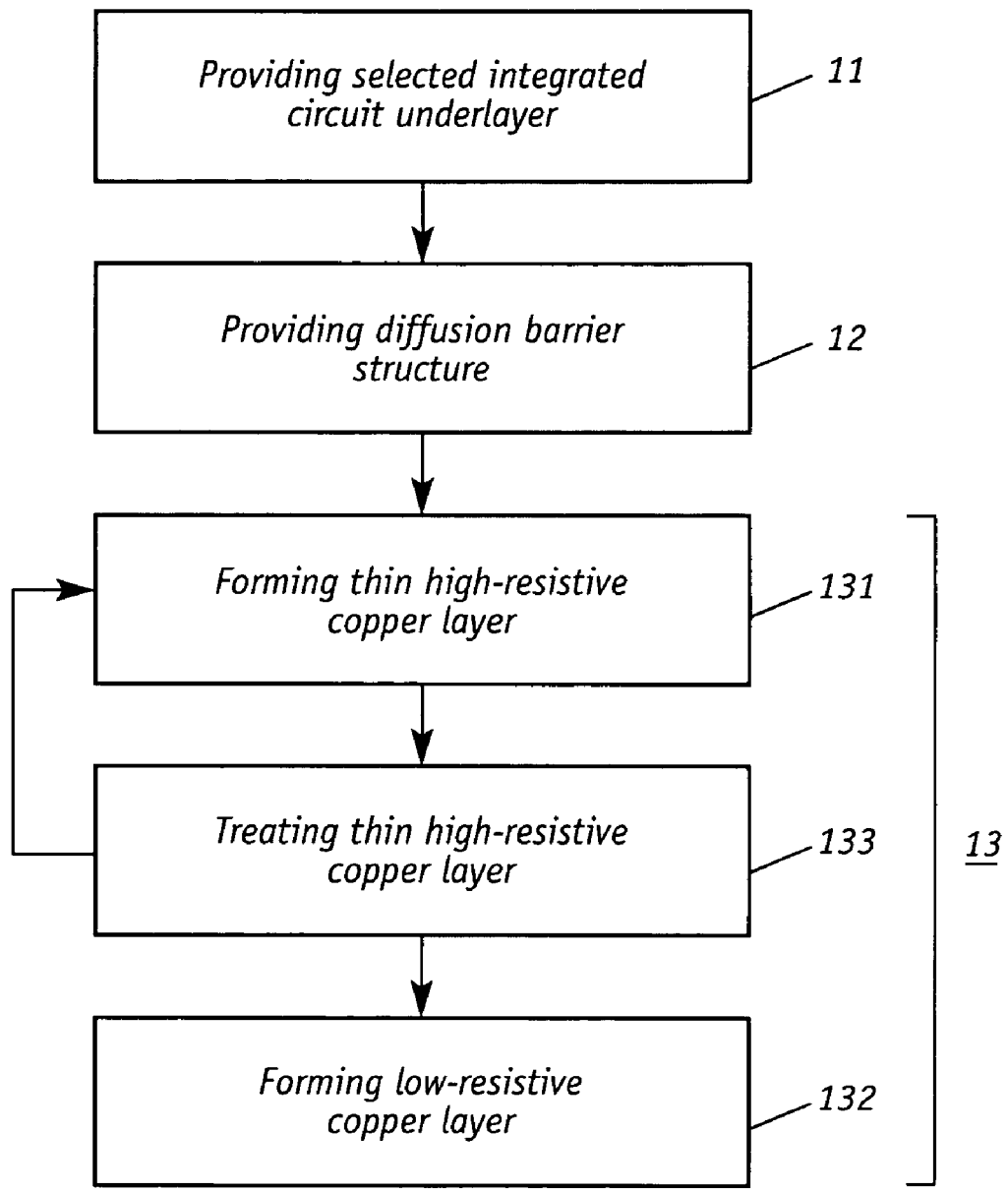
FIG. 1 is a flowchart showing steps in the method of using the multilayered copper structure in an integrated circuit processing.

FIG. 1 is a flowchart showing steps in the method of using the multilayered copper structure in an integrated circuit processing. Step 11 provides a selected integrated circuit underlayer. Step 12 provides a diffusion barrier structure. Step 13 provides the copper layer with improved adhesion to the diffusion barrier structure. Step 13 composes of three steps, steps 131, 133 and 132. Step 131 provides the high resistive copper layer, step 133 provides the treatment of the high-resistive copper layer and step 132 provides the low resistive copper layer. Steps 131 and 133 can be repeated a number of times before continuing to step 132.

Figure 2:
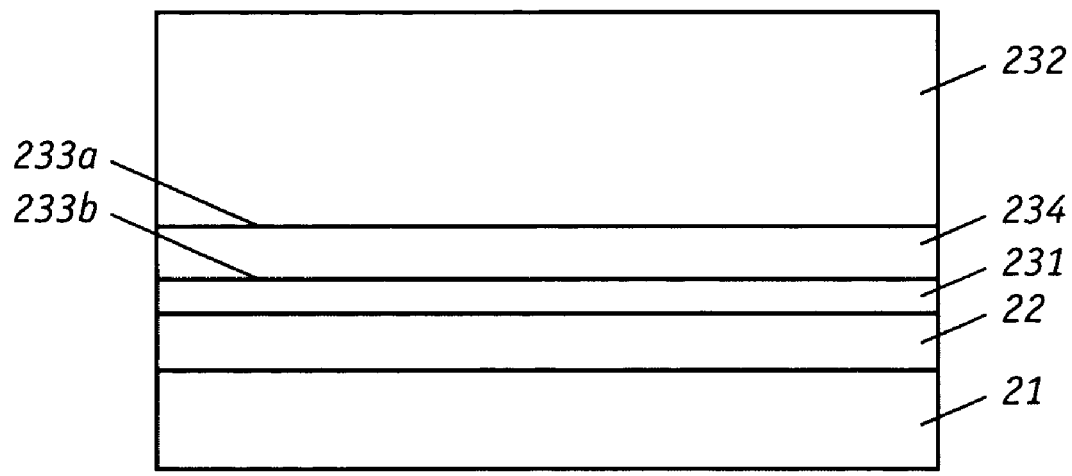
FIG. 2 shows the schematic of the multilayered copper structure in an integrated circuit environment.

FIG. 2 shows the schematic of the multilayered copper structure in an integrated circuit environment resulted from the flowchart in FIG. 1. Layer 21 is the integrated circuit under layer. Layer 22 is the diffusion barrier layer. Layer 231 is the high resistive copper layer. Layer 234 is the treated high resistive copper layer. Layer 232 is the low resistive copper layer. Together layers 231, 234 and 232 form the multilayered copper structure. The interface 233a between the treated high resistive copper layer 234 and the low resistive copper layer 232 and the interface 233b between the treated high resistive copper layer 234 and the high resistive copper layer 231 are not very distinct. It could extend to several nanometers. The diffusion barrier layer 22 serves to prevent diffusion of copper to the underlayer 21. The high resistive copper layer 231 serves to provide the adhesion between the diffusion barrier layer 22 and the low resistive copper layer 232. In this structure, the treatment of the high resistive copper layer is not complete, thus creating treated layer 234 on top of the untreated layer 231. This is desirable since the untreated layer 231 serves as an adhesion layer, and the treated layer 234, with lower resistivity, serves as a conduction layer.

Figure 3:
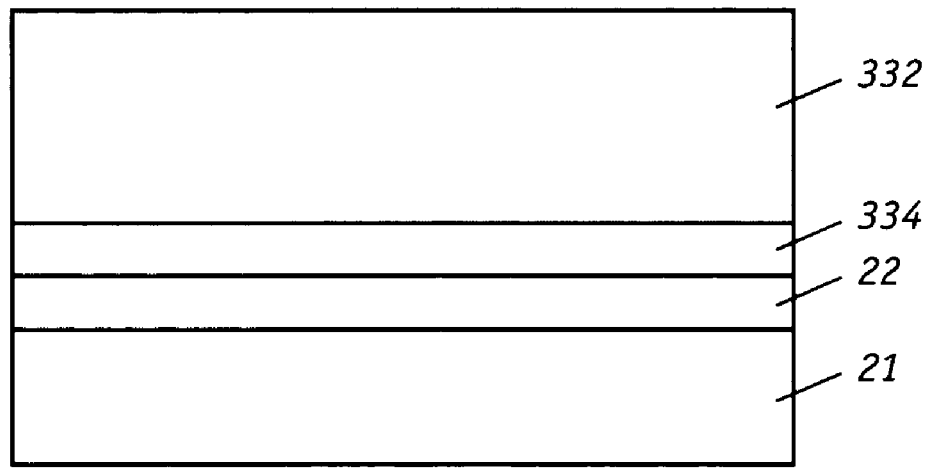
FIG. 3 shows another schematic of the multilayered copper structure in an integrated circuit environment.

FIG. 3 shows another schematic of the multilayered copper structure in an integrated circuit environment. Layer 21 is the integrated circuit underlayer. Layer 22 is the diffusion barrier layer. Layer 334 is the treated high resistive copper layer. Layer 332 is the low resistive copper layer. Together layers 334 and 332 form the multilayered copper structure. In this structure, the untreated high resistive copper layer has been consumed completely by the treated layer 334. The adhesion in this structure might be compromised with the advantage of lower resistivity because there is no high resistive copper layer anymore.

The underlayer 21 could be the active region of the silicon devices. Since copper introduces a midgap state in the silicon semiconductor, the presence of copper in silicon greatly reduces the resistance of the silicon devices to electrical noise. Therefore to incorporate copper into integrated circuit processing, a diffusion barrier layer 22 is needed to prevent copper from migrating to the underlayer 21. The low contact resistance between the underlayer 21 and the copper layers 231, 234, 232 and 334, 332 is a requirement to achieve fast circuit response. Therefore the underlayer 21 and the diffusion barrier 22 often have a silicide layer to reduce the contact resistance between these two layers.

What is claimed is:

1. A method to form a multilayer metal structure for improving adhesion to an underlying diffusion barrier layer, the method comprising the steps of:
    a) forming a thin high-resistive metal layer, whereby this high-resistive layer serves to improve the adhesion of metal to the underlying diffusion barrier layer;
    b) treating the thin high-resistive metal layer to reduce the resistance of the thin high-resistive metal layer, whereby the treatment step improves the conductivity of the high-resistive metal layer without destroying the adhesion property; and
    c) forming a low-resistive metal layer, in which the resistivity of the low-resistive layer is lower than the resistivity of the treated high-resistive layer, whereby this layer serves to carry the electrical current with minimum electrical resistance.

2. A method as in claim 1 in which the higher value in resistivity of the high-resistive metal layer is due to the presence of oxygen.

3. A method as in claim 1 in which the steps a) and b) are repeated a plurality of times before continuing to step c) to achieve a desired thickness.

4. A method as in claim 1 in which the total thickness of the treated high-resistive metal layer is less than 5 nm.

5. A method as in claim 1 in which the resistivity of the high-resistive metal layer is between 10 to 500 µΩ-cm.

6. A method as in claim 1 in which the resistivity of the treated high-resistive metal layer is between 3 to 400 µΩ-cm.

7. A method as in claim 1 in which the thickness of the high-resistive metal layer in step a) is less than one monolayer for ease of treatment in step b).

8. A method as in claim 1 in which the formation of the high-resistive metal layer in step a) is by adsorption of a metal-carrying precursor.

9. A method as in claim 1 in which the high-resistive metal layer is deposited by the chemical vapor deposition method employing a combination of process precursors and process conditions to achieve a resistivity between 10 to 500 µΩ-cm.

10. A method as in claim 9 in which the process precursors are exposed to a plasma power source, whereby this exposure serves to break up the precursors for easier incorporation of impurities into the high-resistive metal layer.

11. A method as in claim 9 in which the process precursors comprises a liquid metal precursor and an oxygen-contained precursor, whereby the liquid metal precursor serves to deposit a metal layer, and the oxygen-contained precursor serves to incorporate oxygen into the deposited metal layer to achieve the resistivity between 10 to 500 µΩ-cm.

12. A method as in claim 11 in which the oxygen-containing precursor is a precursor comprising an oxygen species, the oxygen species being selected from a group consisting of $O_2$, $N_2O$, $NO_2$, air, water vapor, alcohol vapor, OH ligand, and chemicals containing OH ligand, and chemicals releasing OH ligand upon annealing.

13. A method as in claim 1 in which the treating of the high-resistive metal layer is by the method of oxygen gettering.

14. A method as in claim 1 in which the treating of the high-resistive metal layer is by the reaction of plasma hydrogen.

15. A method as in claim 1 in which the treating of the high-resistive metal layer is by the introduction of organic compounds to reduce metal oxide to the metal and volatile organic by-products.

16. A method as in claim 1 in which the treating of the high-resistive metal layer is by the introduction of a gettering metal precursor, the gettering metal is selected from a group of metals wherein its oxide conducts electricity.

17. A method as in claim 1 in which the treating of the high-resistive metal layer is by the introduction of an alloying metal precursor, the alloying metal is selected from a group of metals that forms an alloy with metal oxide such that the alloy is not non-conducting of electricity.

18. A method as in claim 1 in which the low-resistive metal layer is deposited with the resistivity less than 3 µΩ-cm.

19. A method as in claim 1 in which the low-resistive metal layer is deposited by the electrochemical deposition method.

20. A method as in claim 1 in which the low-resistive metal layer is deposited by the chemical vapor deposition method.

21. A method as in claim 1 in which the low-resistive metal layer is deposited sequentially by the chemical vapor deposition method and then by the electrochemical deposition method.

22. A method as in claim 1 comprising a further step, preceding step a): of
   c) depositing the underlying diffusion barrier structure on a substrate, whereby the diffusion barrier structure serves to prevent the diffusion of metal into the substrate.

23. A method to form a multilayer metal structure for improving adhesion to an underlying diffusion barrier layer, the method comprising the steps of:
   a) forming a thin high-resistive metal layer, whereby this high-resistive layer serves to improve the adhesion of metal to the underlying diffusion barrier layer;
   b) treating the thin high-resistive metal layer to reduce the resistance of the thin high-resistive metal layer by introducing organic compounds to reduce metal oxide to metal and volatile organic by-products, whereby the treatment step improves the conductivity of the high-resistive metal layer without destroying the adhesion property; and
   c) forming a low-resistive metal layer, in which the resistivity of the low-resistive layer is lower than the resistivity of the treated high-resistive layer, whereby this layer serves to carry the electrical current with minimum electrical resistance.

24. A method to form a multilayer metal structure for improving adhesion to an underlying diffusion barrier layer, the method comprising the steps of:
   a) forming a thin high-resistive metal layer, whereby this high-resistive layer serves to improve the adhesion of metal to the underlying diffusion barrier layer;
   b) treating the thin high-resistive metal layer to reduce the resistance of the thin high-resistive metal layer by introducing a gettering metal precursor, the gettering metal being a metal wherein its oxide conducts electricity, whereby the treatment step improves the conductivity of the high-resistive metal layer without destroying the adhesion property; and
   c) forming a low-resistive metal layer, in which the resistivity of the low-resistive layer is lower than the resistivity of the treated high-resistive layer, whereby this layer serves to carry the electrical current with minimum electrical resistance.

25. A method to form a multilayer metal structure for improving adhesion to an underlying diffusion barrier layer, the method comprising the steps of:
   a) forming a thin high-resistive metal layer, whereby this high-resistive layer serves to improve the adhesion of metal to the underlying diffusion barrier layer;
   b) treating the thin high-resistive metal layer to reduce the resistance of the thin high-resistive metal layer by introducing an alloying metal precursor, the alloying metal is selected from a group of metals that forms an alloy with metal oxide such that the alloy is not non-conducting of electricity, whereby the treatment step improves the conductivity of the high-resistive metal layer without destroying the adhesion property; and
   c) forming a low-resistive metal layer, in which the resistivity of the low-resistive layer is lower than the resistivity of the treated high-resistive layer, whereby this layer serves to carry the electrical current with minimum electrical resistance.

* * * * *